United States Patent [19]

Suzuki

[11] Patent Number: 4,688,932
[45] Date of Patent: Aug. 25, 1987

[54] EXPOSURE APPARATUS

[75] Inventor: Akiyoshi Suzuki, Tokyo, Japan

[73] Assignee: Canon Kabushiki Kaisha, Tokyo, Japan

[21] Appl. No.: 827,015

[22] Filed: Feb. 7, 1986

[30] Foreign Application Priority Data

Feb. 12, 1985 [JP] Japan .................................. 60-024910
Apr. 9, 1985 [JP] Japan .................................. 60-075111
Apr. 9, 1985 [JP] Japan .................................. 60-075112

[51] Int. Cl.⁴ ...................... G03B 27/48; G03B 27/50; G03B 27/70
[52] U.S. Cl. .................................................... 355/51
[58] Field of Search ..................... 355/20, 43, 47–49, 355/51, 57, 60, 66

[56] References Cited

U.S. PATENT DOCUMENTS

3,709,602 1/1973 Satomi .................................. 355/49

Primary Examiner—Richard A. Wintercorn
Attorney, Agent, or Firm—Fitzpatrick, Cella, Harper & Scinto

[57] ABSTRACT

An exposure apparatus for use in the manufacture of semiconductor devices, for transferring an integrated circuit pattern of a reticle onto a semiconductor wafer by use of a projection lens optical system. A portion of the pattern of the reticle is irradiated with a light beam, and the light beam is scanningly deflected so that the whole of the pattern of the reticle is scanned with the light beam, whereby the pattern of the reticle is transferred onto the wafer. For compensation of a curvature of field of the projection lens optical system, the wafer is displaced in the direction of an optical axis of the projection lens optical system in accordance with the position of scan, on the reticle, whereby a high resolving power is assured over the entire surface of the reticle pattern. This allows enlargement of the pattern area of the reticle.

17 Claims, 11 Drawing Figures

EXPOSURE APPARATUS

FIELD OF THE INVENTION AND RELATED ART

This invention relates to an exposure apparatus and, more particularly, to an exposure apparatus for use in the manufacture of semiconductor devices such as integrated circuits, large scale integrated circuits, etc., for transferring by projection exposure a pattern of a mask or reticle (hereinafter simply "reticle") onto a semiconductor wafer.

In the manufacture of semiconductor devices, projection optics are used to project an image of the pattern of the reticle onto the wafer thereby to photolithographically transfer the reticle pattern onto the wafer. This is called projection exposure. Generally, the projection exposure is carried out in either of two manners set forth below.

One is a step-and-repeat type projection exposure process. According to this technique, the surface of the wafer is divided into plural discrete areas and the images of the pattern of the reticle are sequentially transferred onto these areas by use of a projection lens optical system. Upon completion of one exposure (shot), the wafer is displaced by a predetermined amount and, then, the projection exposure relative to the next one of the areas of the wafer is effected. By repeating such sequential operation, exposures relative to all the discrete areas of the wafer are completed.

The other projection exposure method is a scan type projection exposure method using a mirror projection optical system such as disclosed in U.S. Pat. No. 4,097,125 issued June 27, 1978. According to this technique, the mask and the wafer are disposed in an object plane and an image plane of the mirror optical system, respectively, and an arcuate region of the field of projection of the mirror optical system in which aberrations are particularly satisfactorily corrected is used for the sake of pattern transfer. By moving the mask and the wafer as a unit relative to the mirror optical system, the wafer is scanned with the imaging beam so that the circuit pattern of the mask is transferred onto the wafer.

From a viewpoint of recent tendency to further miniaturization of the circuit pattern of the semiconductor device, the projection exposure process of step-and-repeat type using a lens optical system has become more attractive because a high resolving power is relatively easily attainable with this technique. In the step-and-repeat type projection exposure, the area to be covered by one shot (one exposure), i.e. the extension of the field of projection of the projection optical system which determines the maximum transferable size of the pattern of the reticle, is subject to the optical characteristics or performance of the projection lens optical system used. In general, an attempt to achieving a higher resolving power in a projection lens optical system ends in reduction in the field of projection of the projection lens optical system. As it has been experientially recognized, in a projection lens optical system, there exists such a relation as follows:

(projection field)/(resolvable min. line width)=constant.

This means that, when the optical system is regarded as a kind of information transmitting means, the amount of information to be transmitted by the optical system is substantially constant.

In view of increasing capacities of semiconductors devices, it is very desirable to increase the amount of information-transmission through the projection optical system and thereby to accomplish a semiconductor device manufacturing system which can easily meet a possible further miniaturization of the semiconductor devices.

In the course of design of lens optical systems, curvature of field is one of the most important factors which constrict the field of view of the lens optical system, resulting in reduction in the transferable size of the reticle pattern. When an attempt is made to suppress the curvature of field to attain a wider flat field thereby to enlarge the field of view of the lens optical system, it causes in general an increase in a high-order off-axis spherical aberration (called "halo"). The increase in the halo disadvantageously degrades the resolving power of the lens optical system. For this reason, in the exposure apparatuses of step-and-repeat type using lens optical systems, it is not easy to achieve enlargement of the area to be covered by one shot while retaining a high resolving power.

SUMMARY OF THE INVENTION

It is accordingly a primary object of the present invention to provide an exposure apparatus by which a large area can be covered by one shot while retaining a high resolving power.

It is another object of the present invention to provide an exposure apparatus by which a usable field of view of a lens optical system employed therein can be increased.

Briefly, according to one aspect of the present invention, there is provided an apparatus for transferring a pattern of a first object onto a second object, said apparatus comprising: a projection optical system for projecting an image of the first object onto the second object; illumination means for irradiating a portion of the first object with a light beam; scanning means for scanningly deflecting the light beam from said illumination means so as to scan the first object with the light beam, so that the pattern of the first object is transferred onto the second object; and adjusting means for changing the positional relation between the image of the first object and the second object in response to the position of scan on the first object by said scanning means so as to conform to a characteristic of image formation, of said projection optical system, which varies in accordance with respective portions of the image of the first object to be projected by said projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
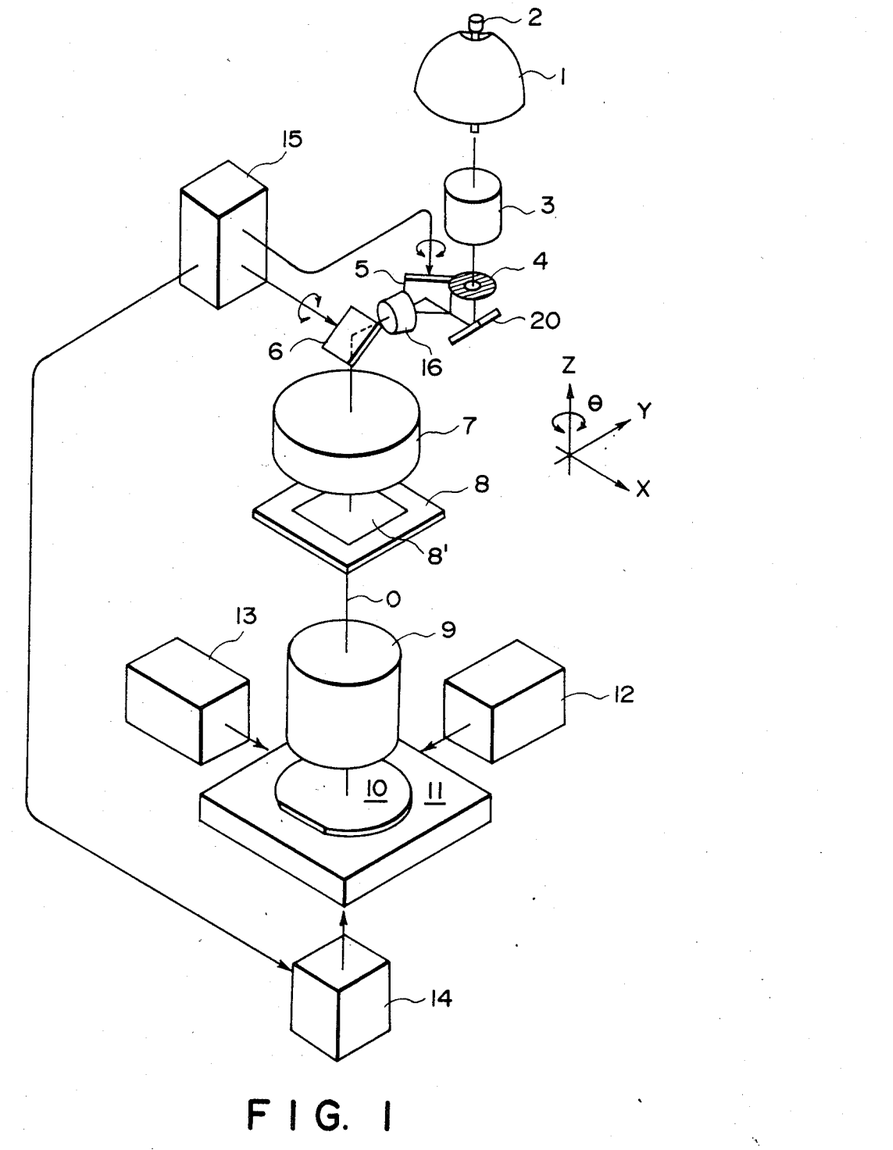
FIG. 1 is a perspective view schematically showing an exposure apparatus according to one embodiment of the present invention.

Referring first to FIG. 1, there is shown a step-and-repeat type exposure apparatus for use in the manufacture of semiconductor devices.

In FIG. 1, the exposure apparatus includes an elliptical mirror 1, a radiation energy source 2, such as a light source comprising a super Hg lamp or an excimer laser, having a radiation emitting portion disposed in the neighborhood of a first focal point of the elliptical mirror 1, a first illumination system 3 and an aperture plate 4 having a circular aperture. The light beam emitted from the lamp 2 is concentrated by the elliptical mirror 1 and directed to the first illumination system 3. By the first illumination system 3, the light beam is directed to the aperture plate 4 to irradiate the same with a predetermined angular distribution. The circular aperture of the aperture plate 4 defines a unit area for the sake of scanning exposure, as will be described later in detail. The light beam passed through the aperture 4 is reflected by a reflection mirror 20 and two swingable scanning mirrors 5 and 6 and then is directed by a second illumination system 7 to the surface of a reticle 8, thereby to irradiate a small portion of an integrated circuit pattern of a reticle 8. In this embodiment, an additional lens system 16 is disposed between the swingable mirrors 5 and 6 so that the oscillating movements of these mirrors do not produce incompatible effects on the light beam. The second illumination system 7 co-operates with the lens system 16 to form an image of the aperture 4 substantially in the plane of the surface of the reticle 8, in order that the reticle 8 is irradiated uniformly with the light beam passed through the aperture 4. The light beam passed through the aperture 4 and reflected by the swingable mirrors 5 and 6 defines a small illumination area on the reticle 8 surface (a spot area in this embodiment) which is scanningly displaced two-dimensionally along the plane of the article 8 surface (X-Y plane) in accordance with the oscillating movements of the mirrors 5 and 6 as denoted by arrows in the drawing. That is, by the oscillating movements of the mirrors 5 and 6, the beam spot formed on the reticle 8 surface is displaced so that the reticle 8 surface bearing a circuit pattern 8' is scanned with the light beam from the aperture 4.

Figure 4:
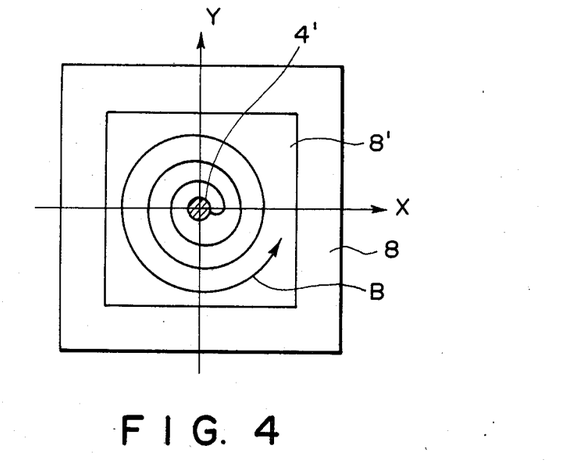
FIG. 4 is a plan view of a reticle, for schematically showing an example of the manner of scan according to the embodiments of FIGS. 1 and 2.

FIG. 4 shows an example of the manner of scan of the reticle 8 with the beam spot. Denoted in this Figure by numeral 4' is an image of the aperture 4 formed on the reticle 8 surface by the co-operation of the second illumination system 7 and the lens system 16. In this example, the mirrors 5 and 6 are oscillatingly moved in such manner that the aperture image 4' is spirally displaced in the plane of the reticle 8 surface, as denoted by an arrow B, from the position corresponding to the center of the reticle 8. The illustration of FIG. 4 in fact contains an exaggeration in respect to the manner of spiral scan and, actually, the beam spot forming the aperture image 4' is scanned such that an outer segment of the spiral trace, along which the beam is scanned, intimately contact with or partially overlap an inner segment the spiral trace, adjacent to the outer segment. By this, the whole surface of the pattern area 8' of the reticle 8 is completely exposed to the scanning beam spot.

Referring back to FIG. 1, the exposure apparatus further includes a projection lens optical system 9 for projecting an image of the pattern 8' of the reticle 8 onto the surface of a semiconductor wafer 10. In this embodiment, the projection lens optical system 9 has a reduced magnification or a unit magnification. The wafer 10 is placed on a wafer stage 11. The wafer stage 11 is movable in X, Y and Z directions by means of driving units 12-14 and in $\theta$ (rotational) direction by means of an unshown driving unit carried by the wafer stage 11. Denoted, in this Figure, by numeral 15 is a drive control unit which is operative to oscillatingly move the mirror 5 about an axis extending in the Z direction, oscillatingly move the mirror 6 about an axis extending in the X direction, and actuate the driving unit 14 so as to displace the wafer 10 held on the wafer stage 11 in the Z direction in synchronization with the oscillating movements of the mirrors 5 and 6.

In the present embodiment, during one complete operation for exposing one of individual areas of the semiconductor wafer 10 to the light passed through the reticle 8 so as to transfer the reticle pattern onto the one area of the wafer 10, the wafer stage 11 is moved by the driving unit 14 in the Z-axis direction, i.e. in the direction of an optical axis O of the projection lens optical system 9, in accordance with the position of scan, on the reticle 8 surface, by the aperture image 4'. The amount of such driving movement in the Z-axis direction is controlled by the drive control unit 15 synchronously with the movements of the mirrors 5 and 6, so that the Z-axis movement is conformed to the characteristic of the curvature of field of the projection lens optical system 9 which has been preparatively detected.

Figure 7A:
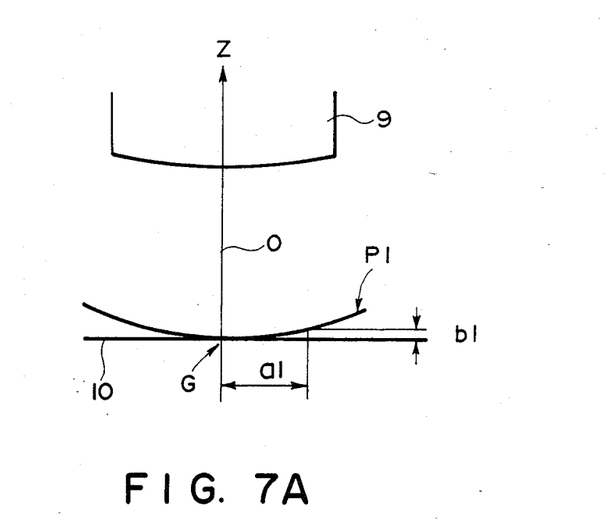
FIGS. 7A-7C are schematic views, respectively, showing the occurrence of the curvature of field and the manner of compensation therefor according to the present invention.

If, for example, the projection lens optical system 9 has a curvature of field such as depicted by a curve P1 shown in FIG. 7A and when the aperture image 4' is formed at a position on the wafer 10 surface located at a distance a1 from the optical system O, the exposure of the wafer at this moment is effected according to the present embodiment just after displacing the wafer 10 held by the wafer stage 11 in the Z direction to a position spaced by a distance b1 along the Z direction from a position which has been assumed by the wafer 10 at the time of exposure thereof to the beam spot, forming the aperture image 4' at the position on the wafer 10 surface intersecting with the optical axis O. By doing so, subtantially the same high-resolution, as obtainable in an area on and in close proximity to the optical axis O, is attainable in the region at the distance a1 from the optical axis O, in which region a high resolving power has not conventionall been attained. As a result, an image of high resolution can be formed on the wafer at the position spaced by the distance a1 from the optical axis O. This means that the area of the wafer covered by one shot, for transferring one complete pattern of the reticle 8, is substantially enlarged.

In place of moving the wafer stage 11, carrying the wafer 10, in synchronization with the scan of the beam spot, the reticle 8 may be moved in the direction of the optical axis O synchronously with the scan of the beam spot. Also, the scan of the beam spot can be effected continuously or interruptedly (i.e. stepwise).

Figure 5A:
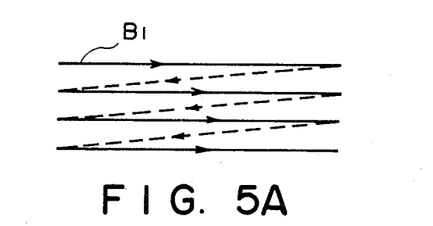
FIGS. 5A-5C are schematic views, respectively, showing further examples of the manner of scan according to the embodiments of FIGS. 1 and 2.
Figure 5B:
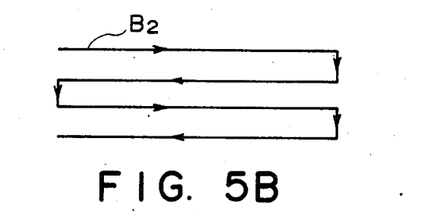
Figure 5C:
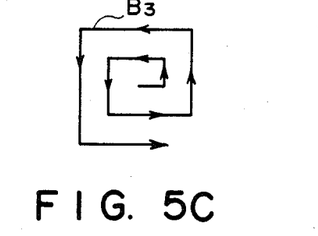

While in the foregoing the spiral form has been described with reference to the manner of scan of the reticle pattern 8' by the aperture image 4', the scan may be effected in any of other forms. FIGS. 5A-5C show examples of other scanning forms which are applicable to the embodiment of FIG. 1. Of these figures, FIG. 5A shows raster scanning and FIG. 5B shows reciprocating scanning. FIG. 5C shows square scanning. In any of these scanning types, the amount of displacement of the wafer 10 or the reticle 8 to be made in the direction of the optical axis O can be determined, simply by preparatively detecting the interrelation between the projection lens optical system 9 and the respective positions of the scanning aperture image 4' on the surface of the reticle 8 or the wafer 10. Therefore, the displacement of the wafer 10 or the reticle 8 can be easily controlled during the exposure operation per one shot.

The shape of the aperture 4 is not limited to a circle, and rectangular shapes such as square and oblong may be adopted.

Figure 2:
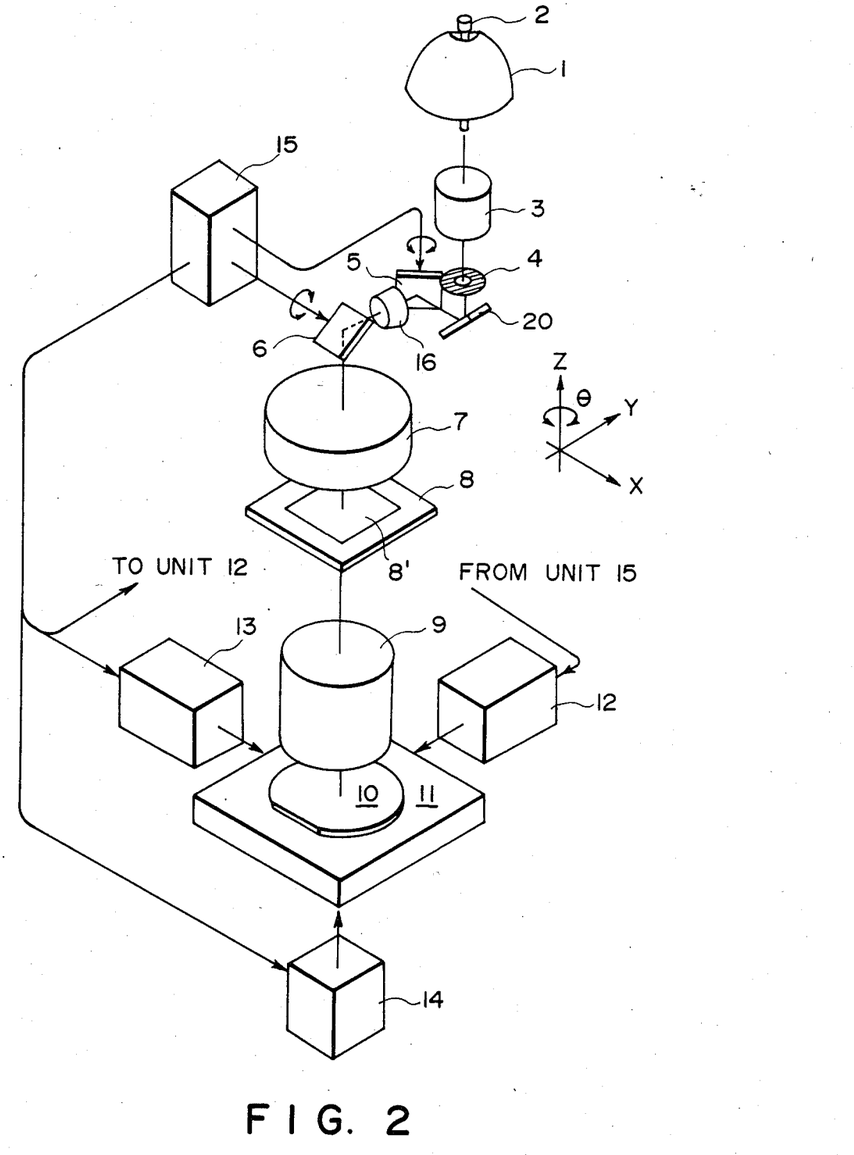
FIG. 2 is a perspective view schematically showing an exposure apparatus according to another embodiment of the present invention.

Referring now to FIG. 2, an exposure apparatus according to another embodiment of the present invention will be described. Briefly, the exposure apparatus of this embodiment is arranged such that distortion characteristics of the projection optical system 9 itself and a magnification error due to any error in the setting of the projection optical system 9 or for any other reason, as well as the curvature of field of the projection optical system 9, are compensated for during the exposure operation. For this purpose, the wafer 10 held on the wafer stage 11 is displaced by the driving units 12 and 13 also in the X and Y directions in synchronization with the scan of the aperture image 4' by the mirrors 5 and 6. More specifically, in this embodiment, the curvature of field, the distortion characteristics and the magnification error of the projection lens optical system 9 have preparatively been measured. And, in response to signals supplied from the drive control unit 15 in accordance with the positions of the mirrors 5 and 6, the driving units 12-14 are controlled so that the wafer 10 is displaced in the X, Y and Z directions by amounts corresponding to the measured values with respect to the above-mentioned optical characteristics of the projection optical system 9. Since the remaining portion of this embodiment is essentially the same as the corresponding portion of the FIG. 1 embodiment, explanation of such similar portion will be omitted here only for the sake of simplicity of description, by assigning the same reference numerals to elements having corresponding functions as of those of the FIG. 1 embodiment.

Figure 6:
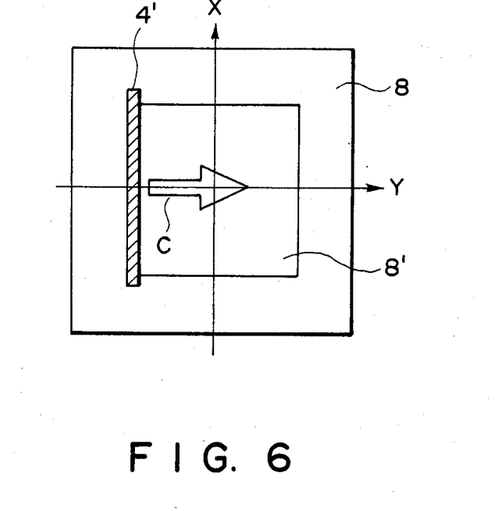
FIG. 6 is a plan view of a reticle, for schematically showing an example of the manner of scan according to the embodiment shown in FIG. 3.

A further embodiment of the present invention will now be described with reference to FIGS. 3 and 6. The present embodiment is arranged such that the aperture image 4' which defines an illumination area on the surface of the reticle 8, carrying the circuit pattern 8', is enlarged to a form of a rectilinear slit and such slit-like aperture image 4' is scanned one-dimensionally along the surface of the reticle 8. The aperture image 4' in the form of a linear slit has a length, in the X direction orthogonal to the scanning direction C (Y direction), which is greater than the width of the pattern 8' in the same direction (X direction). As a result, one-dimensional scanning in the Y direction fully covers the whole of the pattern 8' area.

Figure 3:
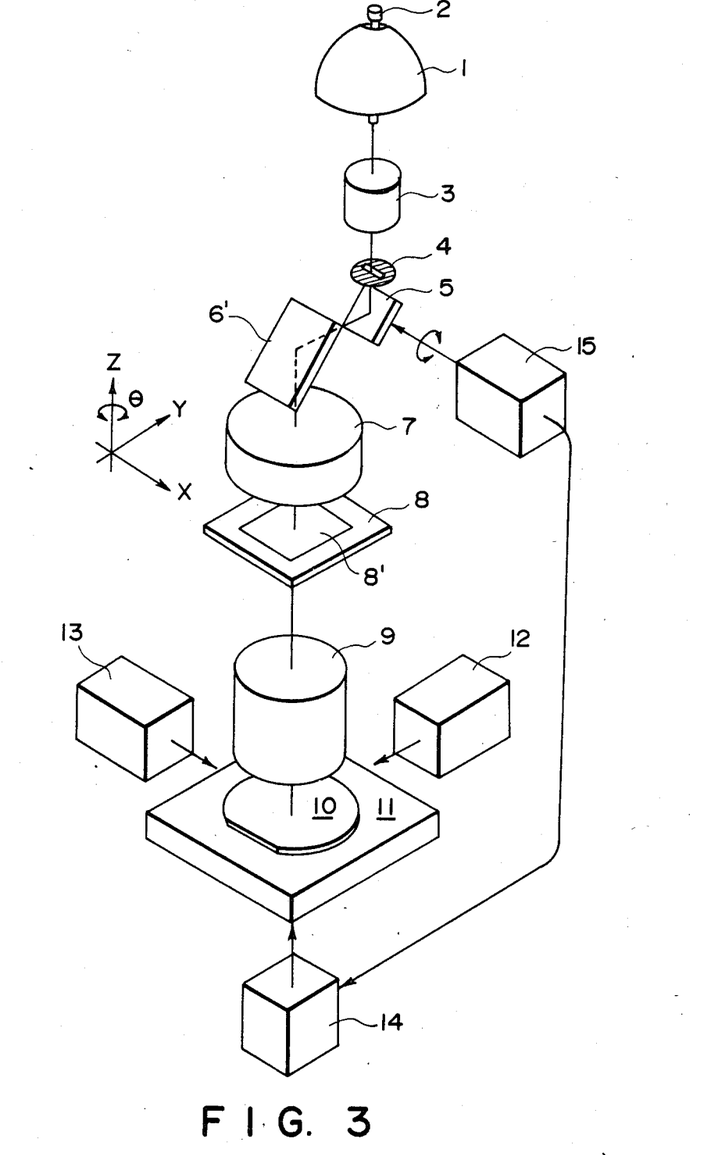
FIG. 3 is a perspective view schematically showing an exposure apparatus according to a further embodiment of the present invention.

In FIG. 3 showing the present embodiment, the exposure apparatus includes an elliptical mirror 1, a radiation energy source 2 and a first illumination optical system 3, all of which are essentially the same as those of the FIG. 1 embodiment. The exposure apparatus further includes an aperture plate 4 having an aperture which, in this embodiment, has a rectilinear slit-like shape. The light beam emitted from the lamp 2 and passed through the aperture of the aperture plate 4 is reflected by a swingable mirror 5 which is oscillatingly movable in the direction of an arrow about an axis extending in the X direction, by means of a drive control unit 15. The light beam reflected from the mirror 5 is again reflected by a stationary mirror 4 toward a second illumination system 7. By this second illumination system 7, the light beam is directed to the reticle 8 to illuminate a portion of the same. Also in the present embodiment, the image 4' of the aperture 4 is formed on a circuit pattern 8' of the reticle 8.

Figure 7B:
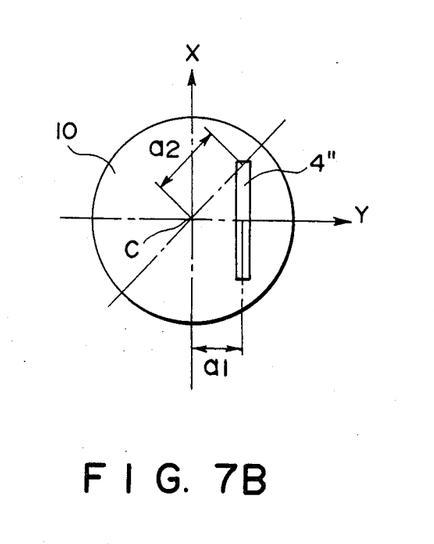
Figure 7C:
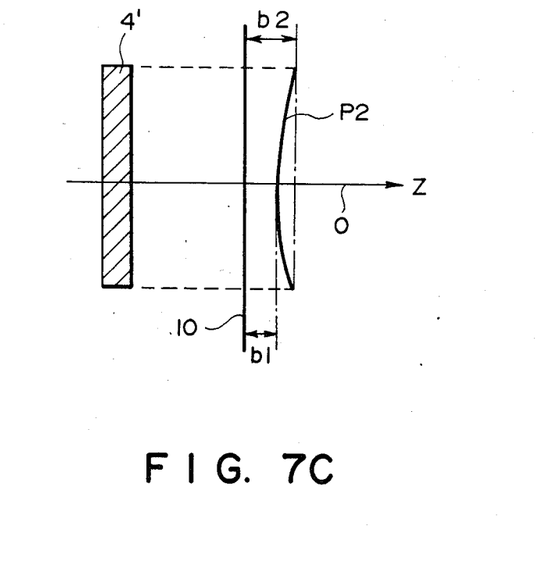

Similarly to the foregoing embodiments, a semiconductor wafer 10 held by a wafer stage 11 is displaced, during one complete exposure operation, by a driving unit 14 in the direction of the Z-axis, i.e. in the direction of the optical axis of a projection lens optical system 9. The amount of such displacement in the Z-axis direction is controlled by the drive control unit 15 in synchronization with the oscillating movement of the mirror 5, so that the displacement is conformed to or substantially conformed to the characteristics of the curvature of field of the projection optical system 9 which have preparatively been measured. More particularly, in the present embodiment, the amount of displacement of the wafer 10 is 10 determined such that the wafer surface is always located at a position corresponding to an average of the image surface positions defined within the aperture image 4'. For example, it is now assumed that the projection optical system 9 has a curvature of field such as depicted by the curve P1 shown in FIG. 7A and that the aperture image denoted by numeral 4" (FIG. 7B) is formed on the wafer 10 surface at a position spaced by a distance a1 from the optical axis O in the Y direction. If, in such occasion, the image surface portion according to the curvature of field of the projection lens system 9 corresponding to the position spaced by the distance a1 from the optical axis O in the Y direction is such as denoted by b1 in FIG. 7C, and if the image surface position according to the curvature of field corresponding to an end of the aperture image 4" (which is located at a position further displaced from the position of the distance a1, in the X direction), i.e. corresponding to the position spaced by a distance a2 in FIG. 7B from the optical axis O is such as denoted by b2 in FIG. 7C, then the image surface within the area corresponding to the aperture image 4" shows such characteristic as depicted by a curve P2 in FIG. 7C. In accordance with the present embodiment, in such case, the wafer 10 held on the wafer stage 11 is displaced, as compared with the position of the Gaussian image surface G to be defined on the optical axis O, in the direction toward the projection optical system 9 by an average distance (b1+b2)/2.

With the above-described arrangement of the present embodiment, a similar high resolving power as attainable in an area on and in close proximity to the optical axis O, is attainable in such region spaced from the optical axis O by a distance (a1, a2). As a result, an image can be formed on such region of the wafer with a high resolving power. Since the remaining portion of the present embodiment is essentially the same as those of the foregoing embodiments, description of such similar portion will be omitted here only by assigning the same reference numerals to elements having corresponding functions as of those of the foregoing embodiments.

In accordance with the present invention, as has hitherto been described, degradation of the resolution doe to the curvature of field of the projection optical system is prevented. As a result, a circuit pattern having a large area can be transferred onto the wafer with a high resolution. Thus, according to the present invention, an exposure apparatus having a high resolution and attaining a high throughput is assured.

While the invention has been described with reference to the structures disclosed herein, it is not confined to the details set forth and this application is intended to cover such modifications or changes as may come within the scope of the following claims.

What is claimed is:

1. An apparatus for transferring a pattern of a first object onto a second object, said apparatus comprising:
   a projection optical system for projecting and forming an image of the first object onto the second object;
   illumination means for irradiating a portion of the first object with a light beam;
   scanning means for scanningly deflecting the light beam from said illumination means so as to scan the first object with the light beam, so that the pattern of the first object is transferred onto the second object; and
   adjusting means for changing the positional relation between the image of the first object and the second object in response to the position of scanning on the first object by said scanning means, so as to conform to a characteristic of image formation of said projecting optical system, which characteristic varies in accordance with respective portions of the image of the first object to be projected by said projection optical system, said adjusting means being adapted to change the positional relation between the image of the first object and the second object with respect to a direction of an optical axis of said projection optical system.

2. An apparatus according to claim 1, wherein said adjusting means is adapted to change the positional relation between the image of the first object and the second object so as to conform to a curvature of field of the projection optical system.

3. An apparatus according to claim 2, wherein said adjusting means is adapted to change the positional relation between the image of the first object and the second object so as to conform to a magnification of projection and a distortion of said projection optical system.

4. An apparatus according to claim 1, wherein said adjusting means is adapted to change the positional relation between the image of the first object and the second object with respect to a plane perpendicular to the optical axis of said projection optical system.

5. An apparatus according to claim 1, wherein said adjusting means is adapted to change the positional relation between the image of the first object and the second object in accordance with the characteristic of image formation of said projection optical system which characteristic corresponds to the position of such area of the first object that is irradiated with the light beam from said illumination means.

6. An apparatus according to claim 5, wherein said adjusting means is adapted to change the positional relation between the image of the first object and the second object in accordance with an average of the characteristics of image formation of said projection optical system which correspond to respective portions of an image of such area of the first object that is irradiated with the light beam from said illumination means.

7. An apparatus according to claim 1, wherein said illumination means is arranged to define an illumination area on the first object which is sufficiently small as compared with an extension of the first object and wherein said scanning means is arranged to scanningly displace the illumination area two-dimensionally.

8. An apparatus according to claim 7, wherein said adjusting means is adapted to change the positional relation between the image of the first object and the second object in accordance with the characteristic of image formation of said projection optical system which corresponds to an image of such area of the first object that is irradiated with the light beam from said illumination means.

9. An apparatus according to claim 1, wherein said illumination means is arranged to define an illumination area on the first object, which area has a length in a direction perpendicular to the direction of scanning by said scanning means, greater than the size of the first object in the direction perpendicular to the direction of scan, and wherein said scanning means is arranged to scanningly displace the illumination area on the first object one-dimensionally.

10. An apparatus according to claim 9, wherein said adjusting means is adapted to change the positional relation between the image of the first object and the second object in accordance with an average of the characteristics of image formation of said projection optical system which correspond to respective portions of an image of such area of the first object that is irradiated with the light beam from said illumination means.

11. An apparatus for transferring a pattern of a first object onto a second object, said apparatus comprising:
    a projection optical system for projecting and forming an image of the first object onto the second object;
    illumination means for irradiating a portion of the first object with a light beam;
    scanning means for scanningly deflecting the light beam from said illumination means so as to scan the first object with the light beam, so that the pattern of the first object is transferred onto the second object; and
    adjusting means for changing the positional relation between the image of the first object and the second object in response to the position of scanning on the first object by said scanning means, so as to conform to a characteristic of image formation of said projection optical system, which characteristic varies in accordance with respective portions of the image of the first object to be projected by said projection optical system, said adjusting means being adapted to displace the second object so as to change the positional relation thereof with respect to said projection optical system.

12. An apparatus for transferring a pattern of a first object onto a second object, said apparatus comprising:

a projection optical system for projecting and forming an image of the first object onto the second object;

illumination means for irradiating a portion of the first object with a light beam;

scanning means for scanningly deflecting the light beam from said illumination means so as to scan the first object with the light beam, so that the pattern of the first object is transferred onto the second object; and adjusting means for changing the positional relation between the image of the first object and the second object in response to the position of scanning on the first object by said scanning means, so as to conform to a characteristic of image formation of said projection optical system, which characteristic varies in accordance with respective portions of the image of the first object to be projected by said projection optical system, said adjusting means being arranged to scanningly deflect the light beam from said illumination means so that the first object is spirally scanned with the light beam.

13. An apparatus for forming a pattern on an object, said apparatus comprising:

a lens optical system having an optical axis;

means for irradiating the object with a light beam by way of said lens optical system;

means for deflecting the light beam from said irradiating means relative to said lens optical system so as to scan the object with the light beam thereby to form the pattern on the object; and means for adjusting a positional relation between said lens optical system and the object in the direction of the optical axis of said lens optical system, in association with the deflection of the light beam by said deflecting means.

14. An apparatus according to claim 13, wherein said adjusting means is operable to displace the object in the direction of the optical axis of said lens optical system.

15. An apparatus for transferring an image of a pattern onto an object, said apparatus comprising:

a projection optical system for projecting the image of the pattern onto the object;

means for irradiating the pattern with a light beam;

means actable on the light beam, between said irradiating means and the pattern, for deflecting the light beam so as to scan the pattern with the light beam thereby to transfer the pattern onto the object; and means for adjusting a positional relation between the object and the image of the pattern as projected by said projection optical system, in association with the deflection of the light beam by said deflecting means.

16. An apparatus according to claim 15, wherein said delfecting means deflects the light beam so that the pattern is scanned two-dimensionally with the light beam.

17. A method of transferring an image of a pattern onto an object, said method comprising the steps of:

placing the object on a stage which is movable in a direction of an optical axis of a projection optical system and in a direction parallel to a plane intersecting the optical axis of the projection optical system;

scanning the pattern with a light beam so that the image of the pattern is transferred onto the object by way of the projection optical system; and adjusting a position of the object by use of the stage, in association with the scan of the pattern.

* * * * *

UNITED STATES PATENT AND TRADEMARK OFFICE
CERTIFICATE OF CORRECTION

PATENT NO. : 4,688,932
DATED : August 25, 1987
INVENTOR(S) : AKIYOSHI SUZUKI

It is certified that error appears in the above-identified patent and that said Letters Patent is hereby corrected as shown below:

COLUMN 1

Line 57, "achieving" should read --achieve--.

COLUMN 2

Line 3, "semiconductors" should read --semiconductor--.

COLUMN 3

Line 52, "article" should read --reticle--.

COLUMN 4

Line 6, "contact" should read --contacts--.
Line 6, "overlap" should read --overlaps--.
Line 7, "segment the" should read --segment of the--.
Line 48, "system" should read --axis--.
Line 61, "conventionall" should read --conventionally--.

UNITED STATES PATENT AND TRADEMARK OFFICE
CERTIFICATE OF CORRECTION

PATENT NO. : 4,688,932
DATED : August 25, 1987
INVENTOR(S) : AKIYOSHI SUZUKI

It is certified that error appears in the above-identified patent and that said Letters Patent is hereby corrected as shown below:

<u>COLUMN 6</u>

Line 14,  "4" should read --6'--.
  Line 33,  "10 is 10 determined" should read --10 is determined--.

<u>COLUMN 7</u>

Line 8,  "doe" should read --due--.
  Line 38,  "projecting" should read --projection--.

Signed and Sealed this

Eighth Day of March, 1988

Attest:

DONALD J. QUIGG

Attesting Officer    Commissioner of Patents and Trademarks